United States Patent
Wang et al.

(10) Patent No.: US 6,797,821 B2
(45) Date of Patent: Sep. 28, 2004

(54) PHOSPHORUS-CONTAINING FLAME-RETARDANT HARDENERS, EPOXY RESINS, ADVANCED EPOXY RESINS AND CURED EPOXY RESINS

(75) Inventors: Chun-Shan Wang, Department of Chemical Engineering, National Cheng Kung University, Tainan (TW); Jeng-Yueh Shieh, Tainan (TW); Ching Hsuan Lin, Tainan (TW)

(73) Assignee: Chun-Shan Wang, Tainan (TW)

( * ) Notice: Subject to any disclaimer, the term of this patent is extended or adjusted under 35 U.S.C. 154(b) by 0 days.

(21) Appl. No.: 10/066,455

(22) Filed: Jan. 30, 2002

(65) Prior Publication Data

US 2003/0120021 A1 Jun. 26, 2003

(30) Foreign Application Priority Data

Sep. 20, 2001 (TW) .......................................... 90123251 A

(51) Int. Cl.⁷ ............................................. C07D 251/70
(52) U.S. Cl. ........................ 544/195; 525/507; 525/523; 528/89; 528/90; 528/94; 528/408; 544/196; 558/76; 558/86; 558/215; 564/230
(58) Field of Search ................................ 525/523, 507; 528/408, 89, 90, 94; 544/195, 196; 558/76, 86, 215; 564/230

(56) References Cited

U.S. PATENT DOCUMENTS

| | | | |
|---|---|---|---|
| 4,086,206 A | * | 4/1978 | Saito et al. .................. 524/100 |
| 4,354,015 A | | 10/1982 | Doorakian |
| 4,389,520 A | | 6/1983 | Gannon et al. |
| 4,618,693 A | | 10/1986 | Saito et al. |
| 5,959,043 A | | 9/1999 | Horold et al. |

FOREIGN PATENT DOCUMENTS

| EP | 067.5131 A1 | 10/1995 |
|---|---|---|
| EP | 0806429 A2 | 11/1997 |
| JP | 60161993 | 8/1985 |
| JP | 61-236787 | 10/1986 |
| JP | 04300968 A | 10/1992 |
| JP | 5-331179 | 12/1993 |
| JP | 0812692 | * 8/1996 |
| JP | 2000344788 | * 12/2000 |

OTHER PUBLICATIONS

Chem. Abstract of JP2000344788, 2000.*
Chem. Abstract of JP0812692, 1996.*
Chun–ShanWang and Jeng–Yueh Shieh, "Synthesis and Properties of Epoxy Resins Containing 2-(6-oxid-6H-dibenz (c,e)(1,2)oxaphosphorin-6-yl)1, 4-benzenediol," Polymer vol. 39, No. 23, pp. 5819–5826, Nov. 1998.
Brochure of Schill & Seilacher entitled "Reactive, halogen-free flame retardants for epoxies," in free circulation since Sep. 1997 (see p. 24).
Abstract of a lecture held in London at the conference Addcon World '98 in Nov. 1998, which abstract has also been published (ISBN: 1–85957–149–2, 6 pages).
Copy of an article entitled "New developments in flame retartded adhesives," published in Sep. 1989 in the journal "Kleben & Dichten, Adhesion" (Engl. gluing & sealing, Adhesion).
Japanese Kokai JP–60, 161, 993 (85, 161, 993), together with the corresponding summary in Patent Abstracts of Japan and Chemical Abstracts (total of 6 pages).

* cited by examiner

Primary Examiner—Philip Tucker
Assistant Examiner—D. Aylward
(74) Attorney, Agent, or Firm—Jackson Walker L.L.P.

(57) ABSTRACT

The present invention discloses an active-hydrogen-containing phosphorus compound for cross-linking a resin and for imparting flame-retardancy to the cured resin, and in particular to a cured frame-retardant epoxy resin prepared by reacting the hardener with a di- or poly-functional epoxy resin via an addition reaction between the active hydrogen and the epoxide group. The present invention also discloses an epoxy resin made from the active-hydrogen-containing phosphorus compound and epihalohydrin.

25 Claims, No Drawings

PHOSPHORUS-CONTAINING FLAME-RETARDANT HARDENERS, EPOXY RESINS, ADVANCED EPOXY RESINS AND CURED EPOXY RESINS

FIELD OF THE INVENTION

The present invention relates generally to an active-hydrogen-containing phosphorus compound for cross-linking a resin and for imparting flame-retardancy to the cured resin, and in particular to a cured frame-retardant epoxy resin prepared by reacting the hardener with a di- or poly-functional epoxy resin via an addition reaction between the active hydrogen and the epoxide group. It also relates to an epoxy resin made from the active-hydrogen-containing phosphorus compound and epihalohydrin.

BACKGROUND OF THE INVENTION

Typical hardeners for epoxy resins and advanced epoxy resins are phenol-formaldehyde novolac resin, dicyandiamide, methylenedianiline, diaminodiphenyl sulfone, phthalic anhydride, and hexahydrophthalic anhydride, etc. The advanced epoxy resins and cured epoxy resins prepared with these hardeners do not have flame retardancy, and thus can not meet the safety requirements.

Several approaches for modification of epoxy backbone for enhancing the thermal properties of epoxy resins have been reported. Aromatic bromine compounds in conjunction with antimony oxide are widely used as a flame retardant for epoxy resins. Tetrabromobisphenol A is a typical example of the aromatic bromine compounds used as a flame retardant for epoxy resins. An excess amount of epoxy resin is reacted with tetrabromobisphenol A to prepare an advanced epoxy resin having two terminal epoxide groups, as shown in the following formula:

the advanced epoxy resin can be employed to encapsulate microelectronic devices, in which the advanced epoxy resin is cured at a high temperature with a curing agent, so that an encapsulant having a flame-retardant property is formed. Typical examples can be found in U.S. Pat. No. 3,040,495 (1961); U.S. Pat. No. 3,058,946 (1962); U.S. Pat. No. 3,294,742 (1966); U.S. Pat. No. 3,929,908 (1975); U.S. Pat. No. 3,956,403 (1976); U.S. Pat. No. 3,974,235 (1976); U.S. Pat. No. 3,989,531 (1976); U.S. Pat. No. 4,058,507 (1997); U.S. Pat. No. 4,104,257 (1978); U.S. Pat. No. 4,170,711 (1979); and U.S. Pat. No. 4,647,648(1987)].

Although the tetrabromobisphenol A-containing advanced epoxy resin shows flame retardant property, major problems encountered with this system are concerned with the generation of toxic and corrosive fumes during combustion such as dioxin and benzofuran.

The flame retardant having a small molecular weight tends to lower the mechanical properties of the epoxy resins, and migrate/vaporize from the epoxy resins such that the flame retardancy thereof diminishes.

It is an object of this invention to provide a phosphorus-containing flame retardant hardener for cross-linking a resin and for imparting flame-retardancy to the cured resin.

It is another object of this invention to provide advanced epoxy resins and cured epoxy resins with good thermal stability, superior heat resistance, and without environmental problem, which are suitable for use in making printed circuit boards and in semiconductor encapsulation applications.

It is also an object of this invention to provide phosphorus-containing flame-retardant epoxy resins which are suitable for use in making printed circuit boards and in semiconductor encapsulation applications.

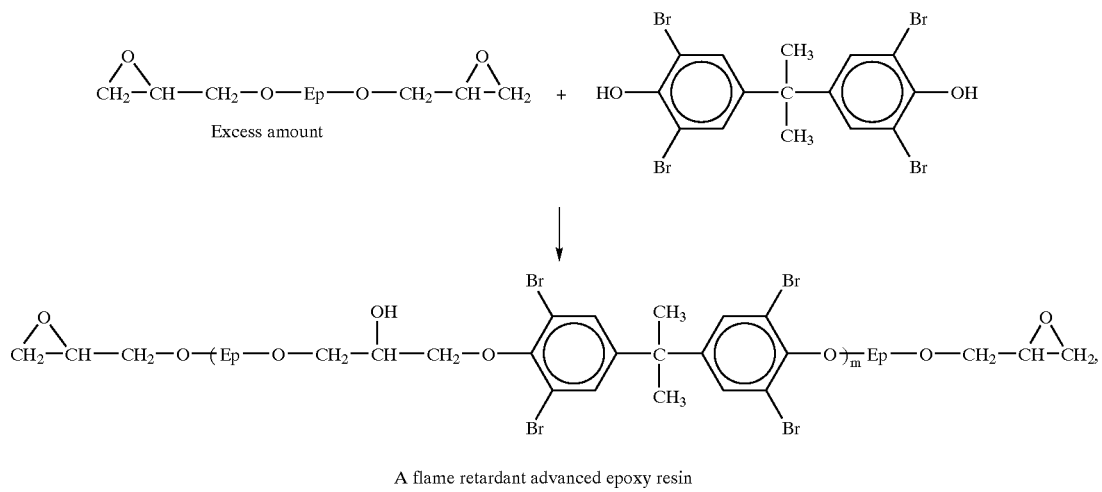

A flame retardant advanced epoxy resin wherein Ep is a bi-radical group of the backbone of the epoxy resin, and m is an integer of 1–10. The advanced epoxy resin can be used in preparing a flame-retardant printed circuit board (FR-4) by impregnating glass fibers with the advanced epoxy resin and heating the resulting composite to cure the advanced epoxy resin. Furthermore,

SUMMARY OF THE INVENTION

In order to accomplish the aforesaid objects, a flame-retardant hardener containing one of the following phosphorus-containing rigid groups was synthesized in the present invention:

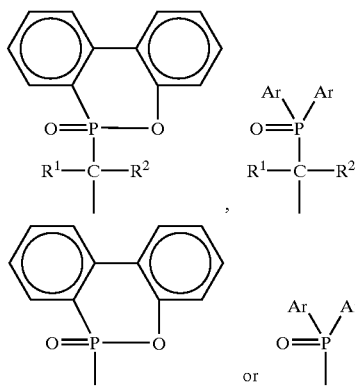

wherein $R^1$ and $R^2$ independently are H, C1~C18 alkyl, C6~C18 aryl, C6~C18 substituted aryl, C6~C18 aryl methylene, or C6~C18 substituted aryl methylene; and Ar is an un-substituted or substituted phenyl or phenoxy radical. The hardener of the present invention is prepared by bounding the phosphorus-containing rigid group to bisphenol-A (BPA), diamonodiphenyl methane (DDM), diaminodiphenyl sulfone (DDS), melamine (MA) or dicyandiamide (DICY). The phosphorus-containing bisphenol-A of the hardeners of the present invention can be reacted with an excess amount of epoxy resin to prepare a flame-retardant advanced epoxy, which is suitable for use in making printed circuit boards.

The present invention also provides a flame-retardant epoxy resin by reacting the hardener of the present invention with an excess of epihalohydrin in the presence of an alkali metal hydroxide.

The present invention also provides a cured flame-retardant epoxy resin by using the hardener of the present invention and a cured flame-retardant epoxy resin from the flame-retardant epoxy resin of the present invention. The cured flame-retardant epoxy resins so prepared have a high glass transition temperature (Tg), high decomposition temperature and high elastic modulus, and are free of toxic and corrosive fumes during combustion, and thus are suitable for printed circuit board and semiconductor encapsulation applications.

DETAILED DESCRIPTION OF THE INVENTION

A phosphorus-containing compound prepared in accordance with the present invention has a formula selecting from the group consisting of (A) to (I):

(A)
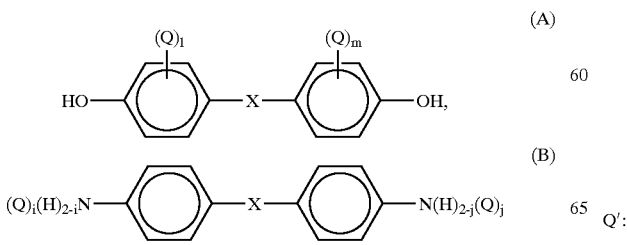

(B)

(C)
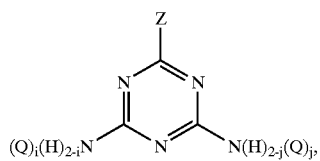

(D)
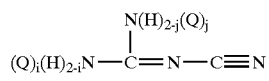

(E)
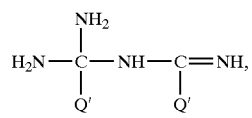

(F)
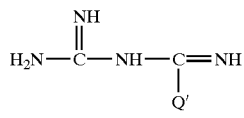

(G)
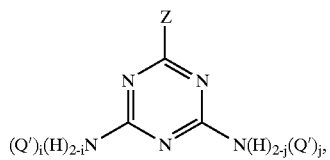

(H)
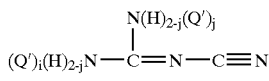

(I)
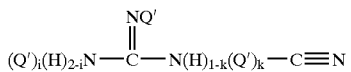

wherein
l and m independently are 0, 1 or 2, and l+m>0; i and j independently are 0, 1 or 2, and 0<i+j<4; k is 0 or 1, and i+k<3;
Z is —$NH_2$, —$CH_3$ or phenyl;

X:
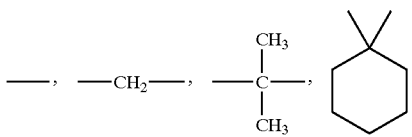

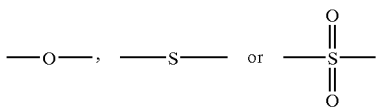

Q:
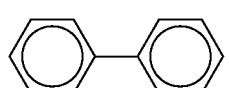

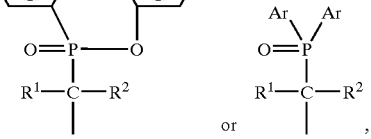

Q':

-continued

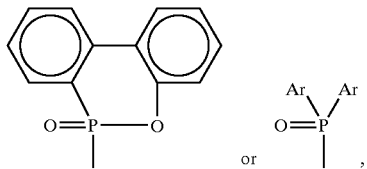 or 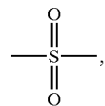, wherein $R^1$, $R^2$ independently are H, C1~C18 alkyl, C6~C18 aryl, C6~C18 substituted aryl, C6~C18 aryl methylene, or C6~C18 substituted aryl methylene;

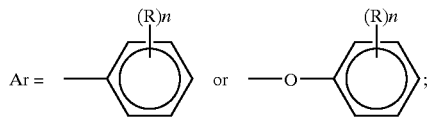

wherein R is C1–C4 alkyl or C6–C18 aryl; and n is an integer of 0 to 5.

Preferably, the phosphorus-containing compound of the present invention has a structure of the formula (A).

Preferably, the phosphorus-containing compound of the present invention has a structure of the formula (B).

Preferably, the phosphorus-containing compound of the present invention has a structure of the formula (C).

Preferably, the phosphorus-containing compound of the present invention has a structure of the formula (D).

Preferably, the phosphorus-containing compound of the present invention has a structure of the formula (E) or (F).

Preferably, the phosphorus-containing compound of the present invention has a structure of the formula (G).

Preferably, the phosphorus-containing compound of the present invention has a structure of the formula (H) or (I).

Preferably, $R^1$ and $R^2$ are hydrogen. Preferably, n is 0.

Preferably, X is

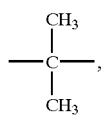

when the phosphorus-containing compound of the present invention has a structure of the formula (A).

Preferably, X is —CH$_2$— or

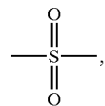, when the phosphorus-containing compound of the present invention has a structure of the formula (B).

Preferably, Ar is phenoxy, when the phosphorus-containing compound of the present invention has a structure of one of the formulas (A) to (D).

Preferably, Ar is phenyl, when the phosphorus-containing compound of the present invention has a structure of one of the formulas (F) to (I).

Preferably, i and j are 0 or 1.

Preferably, Z is —NH$_2$.

Preferably, k is 0.

The present invention also discloses a phosphorus-containing frame-retardant advanced epoxy resin and cured epoxy resin having the following formula (J):

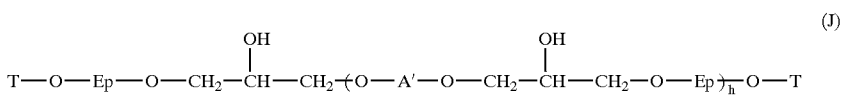 (J)

wherein

0<h<10;

T=L or M, wherein

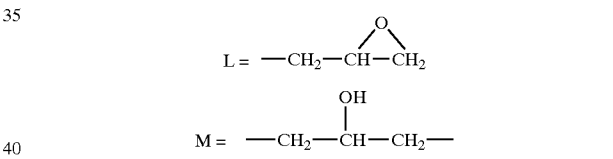

the formula (J) represents the advanced epoxy resin, when T=L; and the formula (J) represents the cured epoxy resin, when T=M;

A' is

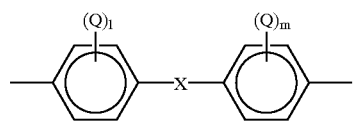

wherein Q, X, l and m are defined as above; and

Ep is

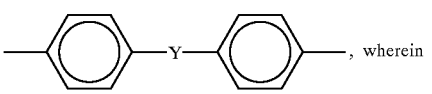, wherein

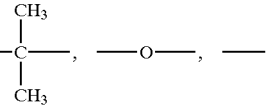

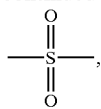

or a phenol-aldehyde novolac epoxy resin backbone, and when Ep is the phenol-aldehyde novolac epoxy resin backbone, the flame-retardant advanced epoxy resin and the cured epoxy resin represented by the formula (J) is prepared by reacting the phosphorus-containing compound (A) with a phenol-aldehyde novolac epoxy resin having the following formula (II)

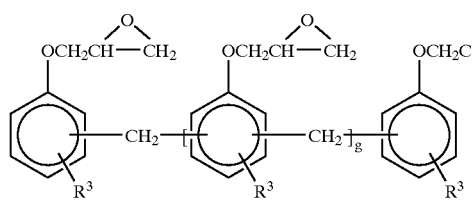

(II)

wherein $R^3$ is hydrogen, or —$CH_3$, and g is an integer of 1–6.

Preferably, Ep in the formula (J) is

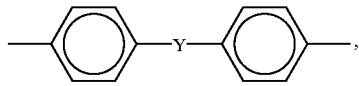

wherein Y is —$C(CH_3)_2$—.

Preferably, Ep in the formula (J) is the phenol-aldehyde novolac epoxy resin backbone, wherein $R^3$ in the phenol-aldehyde novolac epoxy resin (II) is —$CH_3$.

A suitable process for preparing the flame-retardant advanced epoxy resin (J) comprises reacting the phosphorus-containing compound (A) with an excess amount of an epoxy resin having the following formula:

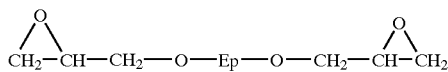

wherein Ep is defined as above.

The phosphorus-containing compounds (A) to (I) of the present invention can be used as a flame-retardant hardener for an epoxy resin, when there is more than one active hydrogen contained therein; and can be used as a flame retardant for the epoxy resin, if there is only one active hydrogen contained therein.

Suitable processes for preparing the phosphorus-containing compounds (A)–(I) of the present invention include (but not limited) processes utilizing the following reactions:

Compounds (A)–(D): Substituted BPA, DDM, DDS, MA and DICY types

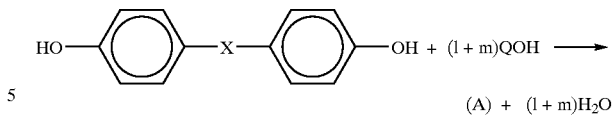

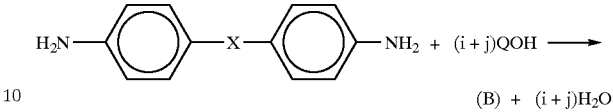

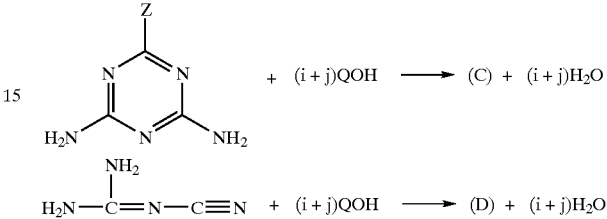

Compounds (E) and (F): Dicyandiamide addition product types

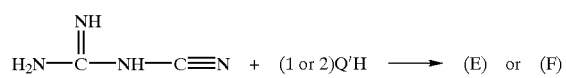

Compounds (G)–(I): Substited melamine and dicyandiamide types

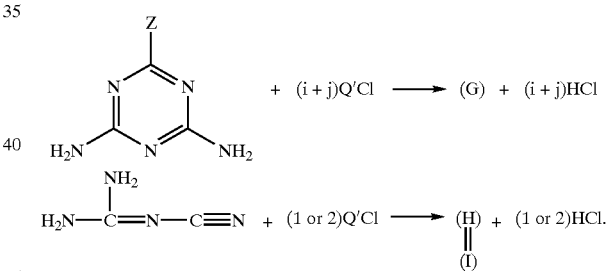

l, m, i, j, k, Z, X, Q and Q' in the aforesaid reactions for synthesizing the phosphorus-containing compounds (A)–(I) are defined as above.

The QOH reactant used in the aforesaid reactions for synthesizing the phosphorus-containing compounds (A)–(D) may be prepared by the following reactions (1) and (2):

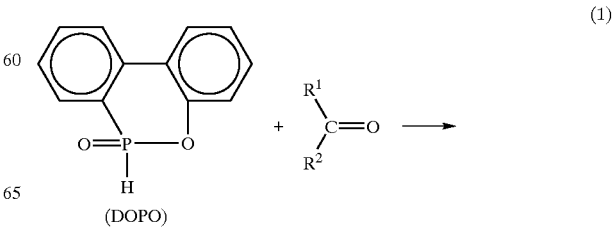

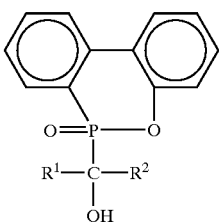

wherein DOPO is an abbreviation of 9,10-dihydro-9-oxa-10-phosphaphenanthrene 10-oxide, $R^1$ and $R^2$ are defined as above. 2-(6-Oxid-6H-dibenz<c,e><1,2>oxa-phosphorin-6-yl)methanol (abbreviated as ODOPM) can be synthesized when $R^1$ and $R^2$ in the reaction (1) are both hydrogen.

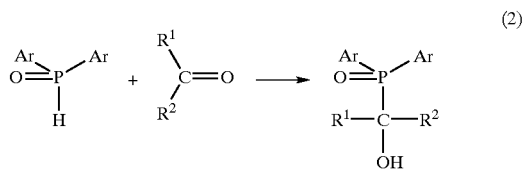
(2)

$R^1$, $R^2$ and Ar in the reaction (2) are defined as above. Diphenoxy phosphoryl methanol (abbreviated as DPOM) can be synthesized when $R^1$, $R^2$ are both hydrogen, and Ar is phenoxy in the reaction (2).

The Q'Cl reactant used in the aforesaid reactions for synthesizing the phosphorus-containing compounds (G)–(I) may be prepared by the following reactions (3) and (4):

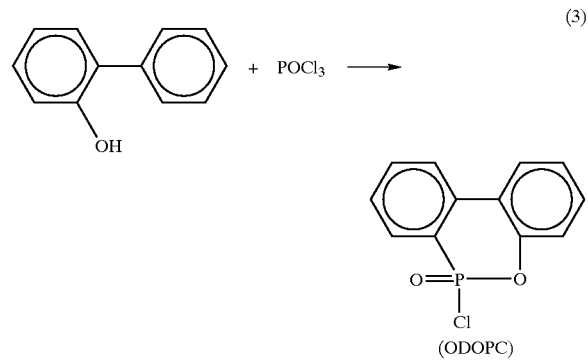
(3)

wherein ODOPC in the reaction (3) is an abbreviation of 2-(6-oxid-6H-dibenz<c,e><1,2>oxa-phosphorin-6-yl)chloride;

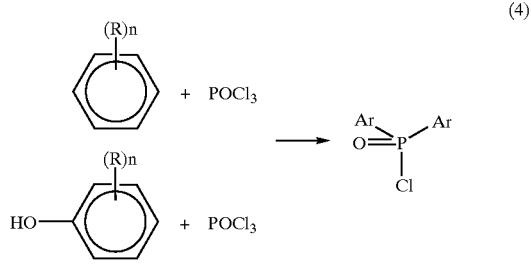
(4)

wherein R, n and Ar In the reaction (4) are defined as above. Diphenyl phosphoryl chloride (abbreviated as DPC) can be synthesized, when R is hydrogen and Ar is phenyl in the reaction (4).

The present invention further synthesized a phosphorus-containing flame-retardant cured epoxy resin by curing an epoxy resin or advanced epoxy resin with the hardener of the present invention alone or together with the conventional curing agent for the epoxy resin in a molten state. The conventional curing agent for the epoxy resin preferably is selected from the group consisting of phenol-formaldehyde novolac resin, dicyandiamide, methylenedianiline, diaminodiphenyl sulfone, phthalic anhydride and hexahydrophthalic anhydride. Preferably, the curing reaction is carried out at a temperature higher than 150° C. and with a stoichiometric amount of the hardener and the curing agent, i.e. the equivalent ratio of the epoxide group in the epoxy resin and/or advance epoxy resin and the functional groups in the hardener and the curing agent is about 1:1. More preferably, the curing reaction is carried out in the presence of a curing promoter such as triphenylphosphine, and in an amount of 0.01–10.0 parts by weight of the curing promoter per 100 parts by weight of the epoxy resin and/or advance epoxy resin. The phosphorus-containing flame-retardant cured epoxy resin of the present invention is suitable for use in making a flame-retardant printed circuit board as a matrix resin and in semiconductor encapsulation.

Preferably, the phosphorus-containing flame-retardant cured epoxy resin of the present invention contains 0.5–30 wt %, and more preferably 0.5–5 wt %, of phosphorus.

A suitable epoxy resin for use in the present invention can be any known epoxy resin, for examples those having two epoxide groups such as bisphenol A epoxy resin, bisphenol F epoxy resin, bisphenol S epoxy resin and biphenol epoxy resin, and those having more than two epoxide groups such as phenol formaldehyde novolac epoxy and cresol formaldehyde novolac epoxy (CNE) with 4–18 functional groups, and mixtures thereof.

An advanced epoxy resin suitable for use in the present invention can be prepared by conducting a curing reaction of the conventional curing agent for an epoxy resin and using an excess amount of an epoxy resin in a molten state.

Preparation of Phosphorus-containing Hardeners i). Substituted bisphenol-A (BPA), diamonodiphenyl methane (DDM), diaminodiphenyl sulfone (DDS), melamine (MA) or dicyandiamide (DICY) types Preparation Example 1-A (P-1-A, ODOPM-BPA-A)

To an one liter four-inlet flask equipped with a thermocouple and temperature controller, a reflux condenser, a nitrogen feed and a mechanical stirrer, 1 mole (228 g) bisphenol-A (BPA) was added, heated to 170° C. and then stirred to a molten state. 0.7 g (0.3 wt %) potassium acetate was mixed with the molten BPA followed by adding slowly 1 mole (246 g) 2-(6-oxid-6H-dibenz<c,e><1,2>oxa-phosphorin-6-yl)methanol (ODOPM). The mixture was heated gradually to a temperature of 220° C. when the addition of ODOPM was completed. The substitution reaction was continued for 6 hours. The reaction product was dissolved in cyclohexanone, and washed with water several times before the solvent was evaporated under vacuum to obtain ODOPM-BPA-A (P-1-A). Yield, 98%; softening temperature, 125–132° C. Phosphorus content: 6.79%.

Preparation Example 1-B (P-1-B, ODOPM-BPA-A)

To an one liter four-inlet flask equipped with a thermocouple and temperature controller, a reflux condenser, a nitrogen feed and a mechanical stirrer, 1 mole (228 g) bisphenol-A (BPA) was added, heated to 170° C. and then stirred to a molten state. 1.14 g (0.5 wt %) potassium acetate was mixed with the molten BPA followed by adding slowly 1.5 mole (369 g) ODOPM. The mixture was heated gradually to a temperature of 220° C. when the addition of ODOPM was completed. The substitution reaction was continued for 8 hours. The reaction product was dissolved in cyclohexanone, and washed with water several times before the solvent was evaporated under vacuum to obtain ODOPM-BPA-B (P-1-B). Yield, 96%; softening temperature, 136–140° C. Phosphorus content: 8.16%.

Preparation Example 1-C (P-1-C, ODOPM-BPA-A)

To an one liter four-inlet flask equipped with a thermocouple and temperature controller, a reflux condenser, a nitrogen feed and a mechanical stirrer, 1 mole (228 g) bisphenol-A (BPA) was added, heated to 170°C. and then stirred to a molten state. 1.14 g (0.5 wt %) potassium acetate was mixed with the molten BPA followed by adding slowly 2 mole (492 g) ODOPM. The mixture was heated gradually to a temperature of 220° C. when the addition of ODOPM was completed. The substitution reaction was continued for 10 hours. The reaction product was dissolved in cyclohexanone, and washed with water several times before the solvent was evaporated under vacuum to obtain ODOPM-BPA-C (P-1-C ). Yield, 92%; softening temperature, 143–148° C. Phosphorus content: 9.06%.

Preparation Example 2 (P-2, DPOM-BPA)

To an one liter four-inlet flask equipped with a thermocouple and temperature controller, a reflux condenser, a nitrogen feed and a mechanical stirrer, 1 mole (228 g) bisphenol-A (BPA) was added, heated to 170° C. and then stirred to a molten state. 0.7 g (0.3 wt %) potassium acetate was mixed with the molten BPA followed by adding slowly 1 mole (264 g) diphenoxy phosphoryl methanol (DPOM). The mixture was heated gradually to a temperature of 220° C. when the addition of DPOM was completed. The substitution reaction was continued for 8 hours. The reaction product was dissolved in cyclohexanone, and washed with water several times before the solvent was evaporated under vacuum to obtain DPOM-BPA (P-2). Yield, 98%; softening temperature, 118–124° C. Phosphorus content: 6.54%.

Preparation Example 3 (P-3, ODOPM-DDM)

To an one liter four-inlet flask equipped with a thermocouple and temperature controller, a reflux condenser, a nitrogen feed and a mechanical stirrer, 1 mole (198 g) diaminodiphenylmethane (DDM) was added, heated to 170° C. and then stirred to a molten state. 0.7 g (0.3 wt %) potassium acetate was mixed with the molten DDM followed by adding slowly 1 mole (246 g) ODOPM. The mixture was heated gradually to a temperature of 220° C. when the addition of ODOPM was completed. The substitution reaction was continued for 8 hours. The reaction product was dissolved in cyclohexanone, and washed with water several times before the solvent was evaporated under vacuum to obtain ODOPM-DDM (P-3). Yield, 98%; softening temperature, 145–149° C. Phosphorus content: 6.57%.

Preparation Example 4 (P-4, DPOM-DDM)

To an one liter four-inlet flask equipped with a thermocouple and temperature controller, a reflux condenser, a nitrogen feed and a mechanical stirrer, 1 mole (198 g) diaminodiphenylmethane (DDM) was added, heated to 170° C. and then stirred to a molten state. 0.7 g (0.3 wt %) potassium acetate was mixed with the molten DDM followed by adding slowly 1 mole (264 g) DPOM. The mixture was heated gradually to a temperature of 220° C. when the addition of DPOM was completed. The substitution reaction was continued for 8 hours. The reaction product was dissolved in cyclohexanone, and washed with water several times before the solvent was evaporated under vacuum to obtain DPOM-DDM (P-4). Yield, 98%; softening temperature, 136–141° C. Phosphorus content: 6.31%.

Preparation Example 5 (P-5, ODOPM-DDS)

To an one liter four-inlet flask equipped with a thermocouple and temperature controller, a reflux condenser, a nitrogen feed and a mechanical stirrer, 1 mole (248 g) diaminodiphenyl sulfone (DDS) was added, heated to 180° C. and then stirred to a molten state. 0.7 g (0.3 wt %) potassium acetate was mixed with the molten DDS followed by adding slowly 1 mole (246 g) ODOPM. The mixture was heated gradually to a temperature of 220° C. when the addition of ODOPM was completed. The substitution reaction was continued for 8 hours. The reaction product was dissolved in cyclohexanone, and washed with water several times before the solvent was evaporated under vacuum to obtain ODOPM-DDS (P-5). Yield, 92%; softening temperature, 147–152° C. Phosphorus content: 5.88%.

Preparation Example 6 (P-6, DPOM-DDS)

To an one liter four-inlet flask equipped with a thermocouple and temperature controller, a reflux condenser, a nitrogen feed and a mechanical stirrer, 1 mole (248 g) diaminodiphenyl sulfone (DDS) was added, heated to 180° C. and then stirred to a molten state. 0.7 g (0.3 wt %) potassium acetate was mixed with the molten DDS followed by adding slowly 1 mole (264 g) DPOM. The mixture was heated gradually to a temperature of 220° C. when the addition of DPOM was completed. The substitution reaction was continued for 8 hours. The reaction product was dissolved in cyclohexanone, and washed with water several times before the solvent was evaporated under vacuum to obtain DPOM-DDS (P-6). Yield, 92%; softening temperature, 141–146° C. Phosphorus content: 6.28%.

Preparation Example 7 (P-7, ODOPM-MA)

To an one liter four-inlet flask equipped with a thermocouple and temperature controller, a reflux condenser, a nitrogen feed and a mechanical stirrer, 1 mole (126 g) Melamine (MA) and 500 ml N,N-dimethylacetamide (DMAc) were added, heated to 90° C. and then stirred until MA was dissolved completely. 0.63 g potassium acetate was mixed with the resulting solution followed by adding slowly 1 mole (246 g) ODOPM. The mixture was heated gradually to a temperature of 168° C. when the addition of ODOPM was completed. The substitution reaction was continued for 8 hours. The reaction mixture was cooled and filtered, and the resulting cake was dried to obtain ODOPM-MA (P-7). Yield, 98%; softening temperature, 129–134° C. Phosphorus content: 8.76%. Nitrogen content: 23.73%.

Preparation Example 8 (P-8, DPOM-MA)

To an one liter four-inlet flask equipped with a thermocouple and temperature controller, a reflux condenser, a nitrogen feed and a mechanical stirrer, 1 mole (126 g) Melamine (MA) and 500 ml N,N-dimethylacetamide (DMAc) were added, heated to 90° C. and then stirred until MA was dissolved completely. 0.63 g potassium acetate was mixed with the resulting solution followed by adding slowly 1 mole (264 g) DPOM. The mixture was heated gradually to a temperature of 168° C. when the addition of DPOM was completed. The substitution reaction was continued for 8 hours. The reaction mixture was cooled and filtered, and the resulting cake was dried to obtain DPOM-MA (P-8). Yield, 98%; softening temperature, 124–130° C. Phosphorus content: 8.33%. Nitrogen content: 22.58%.

Preparation Example 9 (P-9, ODOPM-DICY)

To an one liter four-inlet flask equipped with a thermocouple and temperature controller, a reflux condenser, a nitrogen feed and a mechanical stirrer, 1 mole (86 g) dicyandiamide (DICY) and 500 ml N,N-dimethylacetamide (DMAc) were added, heated to 90° C. and then stirred until DICY was dissolved completely. 0.6 g potassium acetate was mixed with the resulting solution followed by adding slowly 1 mole (246 g) ODOPM. The mixture was heated gradually to a temperature of 168° C. when the addition of ODOPM was completed. The substitution reaction was continued for 8 hours. The reaction mixture was cooled and filtered, and the resulting cake was dried to obtain ODOPM-DICY (P-9). Yield, 98%; softening temperature, 138–143° C. Phosphorus content: 9.87%. Nitrogen content: 17.83%.

Preparation Example 10 (P-10, DPOM-DICY)

To an one liter four-inlet flask equipped with a thermocouple and temperature controller, a reflux condenser, a nitrogen feed and a mechanical stirrer, 1 mole (86 g) dicyandiamide (DICY) and 500 ml N,N-dimethylacetamide (DMAc) were added, heated to 90° C. and then stirred until DICY was dissolved completely. 0.6 g potassium acetate was mixed with the resulting solution followed by adding slowly 1 mole (264 g) DPOM. The mixture was heated gradually to a temperature of 168° C. when the addition of DPOM was completed. The substitution reaction was continued for 8 hours. The reaction mixture was cooled and filtered, and the resulting cake was dried to obtain DPOM-DICY (P-10). Yield, 98%; softening temperature, 129–135° C. Phosphorus content: 9.34%. Nitrogen content: 16.87%.

ii). Dicyandiamide addition product type

Preparation Example 11 (P-11, DOPO-DICY)

To an one liter four-inlet flask equipped with a thermocouple and temperature controller, a reflux condenser, a nitrogen feed and a mechanical stirrer, 1 mole (86 g) dicyandiamide (DICY) was added, heated to 120° C. and then stirred to a molten state. 1 mole (216 g) 9,10-dihydro-9-oxa-10-phosphaphenanthrene-10-oxide (DOPO) was added slowly to the molten DICY, and the resulting mixture was heated gradually to a temperature of 190° C. when the addition of DOPO was completed. The addition reaction was continued for 4 hours. The reaction mixture was cooled to obtain DOPO-DICY (P-11). Yield, 96%; softening temperature, 137–143° C. Phosphorus content: 10.26%. Nitrogen content: 18.54%.

Preparation Example 12 (P-12, DPP-DICY)

To an one liter four-inlet flask equipped with a thermocouple and temperature controller, a reflux condenser, a nitrogen feed and a mechanical stirrer, 1 mole (86 g) dicyandiamide (DICY) was added, heated to 120° C. and then stirred to a molten state. 1 mole (234 g) diphenyl phosphite (DPP) was added slowly to the molten DICY, and the resulting mixture was heated gradually to a temperature of 190° C. when the addition of DPP was completed. The addition reaction was continued for 4 hours. The reaction mixture was cooled to obtain DPP-DICY (P-12). Yield, 96%; softening temperature, 134–138° C. Phosphorus content: 9.68%. Nitrogen content: 17.50%.

iii). Substituted melamine and dicyandiamide types

Preparation Example 13 (P-13, ODOPC-MA)

To an one liter four-inlet flask equipped with a thermocouple and temperature controller, a reflux condenser, a nitrogen feed and a mechanical stirrer, 1 mole (126 g) Melamine (MA) and 500 ml N,N-dimethylacetamide (DAMc) were added, heated to 120° C. and then stirred until MA was dissolved completely. 1 mole (251 g) 2-(6-oxid-6H-dibenz<c,e><1,2>oxa-phosphorin-6-yl)chloride (ODOPC) was added slowly to the resulting solution. The mixture was heated gradually to a temperature of 170° C. when the addition of ODOPC was completed. The reaction was continued for 16 hours. The reaction mixture was cooled and filtered, and the resulting cake was dried to obtain ODOPC-MA (P-13). Yield, 94%; softening temperature, 137–142° C. Phosphorus content: 9.10%. Nitrogen content: 24.67%.

Preparation Example 14 (P-14, DPC-MA)

To an one liter four-inlet flask equipped with a thermocouple and temperature controller, a reflux condenser, a nitrogen feed and a mechanical stirrer, 1 mole (126 g) Melamine (MA) and 500 ml N,N-dimethylacetamide (DAMc) were added, heated to 120° C. and then stirred until MA was dissolved completely. 1 mole (253 g) diphenyl phosphoryl chloride (DPC) was added slowly to the resulting solution. The mixture was heated gradually to a temperature of 168° C. when the addition of DPC was completed. The reaction was continued for 10 hours. The reaction mixture was cooled and filtered, and the resulting cake was dried to obtain DPC-MA (P-14). Molecular weight: 558. Yield, 94%; softening temperature, 131–135° C. Phosphorus content: 9.05%. Nitrogen content: 24.53%.

Preparation Example 15 (P-15, ODOPC-DICY)

To an one liter four-inlet flask equipped with a thermocouple and temperature controller, a reflux condenser, a nitrogen feed and a mechanical stirrer, 1 mole (86 g) dicyandiamide (DICY) and 500 ml N,N-dimethylacetamide (DMAc) were added, heated to 120° C. and then stirred until DICY was dissolved completely. 1 mole (251 g) ODOPC was added slowly to the resulting solution. The mixture was heated gradually to a temperature of 170° C. when the addition of ODOPC was completed. The reaction was continued for 8 hours. The reaction mixture was cooled and filtered, and the resulting cake was dried to obtain ODOPC-DICY (P-15). Molecular weight: 515. Yield, 96%; softening temperature, 134–139° C. Phosphorus content: 10.32%. Nitrogen content: 18.64%.

Preparation Example 16 (P-16, DPC-DICY)

To an one liter four-inlet flask equipped with a thermocouple and temperature controller, a reflux condenser, a nitrogen feed and a mechanical stirrer, 1 mole (86 g) dicyandiamide (DICY) and 500 ml N,N-dimethylacetamide (DAMc) were added, heated to 120° C. and then stirred until DICY was dissolved completely. 1 mole (253 g) DPC was added slowly to the resulting solution. The mixture was heated gradually to a temperature of 170° C. when the addition of DPC was completed. The reaction was continued for 8 hours. The reaction mixture was cooled and filtered, and the resulting cake was dried to obtain DPC-DICY (P-16). Molecular weight: 519. Yield, 96%; softening temperature, 127–132° C. Phosphorus content: 10.25%. Nitrogen content: 18.51%.

Preparation of Phosphorus-containing Advanced Epoxy Resins and Cured Epoxy Resins i). An advanced epoxy resin prepared from bisphenol A epoxy resin and ODOPM-BPA

Example A (P-A)

To a one liter reactor equipped with a temperature controller, a reflux condenser, a nitrogen feed, a vacuum system and a mechanical stirrer, 564 g diglycidyl ether of bisphenol A (BPA epoxy resin) having an epoxide equivalent weight (EEW) of 188 was added, and heated to 110° C. while stirring and vacuuming (<100 mmHg) for a period of 30 minutes to remove a trace amount of water contained in the epoxy resin. The vacuuming was stopped, and dried nitrogen was introduced into the reactor until the atmospheric pressure was reached. The temperature of the reactor was raised to 130° C., and 228 g ODOPM-BPA-A (P-1-A) was then added while stirring. After a molten mixture of ODOPM-BPA-A and BPA epoxy resin was formed, 500 ppm (based on total weight) ethyl triphenyl phosphonium chloride was added, and the temperature of the reaction mixture was increased to 160° C. and maintained at 160° C. for two hours. The equivalent ratio of epoxide group to hydroxyl group was 3.0:1 at the starting point of the reaction. The resultant advanced epoxy resin had an EEW of 396.

Example B (P-B)

The procedures of Example A were repeated except that ODOPM-BPA-A (P-1-A) was replaced by ODOPM-BPA-B (P-1-B). The equivalent ratio of epoxide group to hydroxyl group was 3.0:1 at the starting point of the reaction. The resultant solid advanced epoxy resin had an EEW of 424.

Example C (P-C)

The procedures of Example A were repeated except that ODOPM-BPA-A (P-1-A) was replaced by ODOPM-BPA-C (P-1-C). The equivalent ratio of epoxide group to hydroxyl group was 3.0:1 at the starting point of the reaction. The resultant solid advanced epoxy resin had an EEW of 453.

Control Example A

The procedures of Example A were repeated except that ODOPM-BPA-A (P-1-A) was replaced by bisphenol A. The equivalent ratio of epoxide group to hydroxyl group was 2.04:1 at the starting point of the reaction. The resultant solid advanced epoxy resin (designated as Control) had an EEW of 483.

Control Example B

The procedures of Example A were repeated except that ODOPM-BPA-A (P-1-A) was replaced by tetrabromo-bisphenol A. The equivalent ratio of epoxide group to hydroxyl group was 2.58:1 at the starting point of the reaction. The resultant solid advanced epoxy resin (designated as TBBA) had an EEW of 483.

Control Example C

The procedures of Example A were repeated except that ODOPM-BPA-A (P-1-A) was replaced by bis(3-hydroxyphenyl) phenyl phosphate (BHPP). The equivalent ratio of epoxide group to hydroxyl group was 2.04:1 at the starting point of the reaction. The resultant solid advanced epoxy resin (designated as BHPP) had an EEW of 483.

ii). Preparation of a cured epoxy resin from an advanced epoxy resin

Cured epoxy resins were prepared from the advanced epoxy resins prepared in Examples A-C and Control Examples A-C with a curing agent selected from phenol-formaldehyde novolac resin (PN), melamine-phenol-formaldehyde-novolac resin (MPN) and dicyandiamide (DICY).

The advanced epoxy resin was mixed with the curing agent (1:1 equivalent ratio) at 150° C. with stirring, and the well mixed molten mixture was poured into a hot aluminum mould, cured in an oven at 175° C. for one hour, and then postcured at 200° C. for two hours.

The thermogravimetric analysis data of the resulting cured epoxy resins are shown in Table 1. The flame-retardant properties of the resulting cured epoxy resins are shown in Table 2.

TABLE 1

| Specimens | | | | TGA data | | | | Rapid rate Tr (° C.) | | | | Char yield at 700° C., (%) | |
|---|---|---|---|---|---|---|---|---|---|---|---|---|---|
| | | | | Temperature of 5 wt % loss, ° C. | | Temperature of 10 wt % loss, ° C. | | Step 1 | Step 1 | Step 2 | Step 2 | | |
| Advanced epoxy | Hardener | Content of P (%) | Tg (° C.) | Air | $N_2$ | Air | $N_2$ | Air | $N_2$ | Air | $N_2$ | Air | $N_2$ |
| Control | PN | 0 | 110 | 417 | 423 | 445 | 441 | 466 | 474 | 634 | — | 2 | 15 |
| P-A | PN | 1.54 | 131 | 387 | 387 | 417 | 413 | 455 | 452 | 674 | — | 17 | 24 |

TABLE 1-continued

TGA data

| Specimens | | | Tg | Temperature of 5 wt % loss, °C. | | Temperature of 10 wt % loss, °C. | | Rapid rate Tr (° C.) | | | | Char yield at 700° C., (%) | |
|---|---|---|---|---|---|---|---|---|---|---|---|---|---|
| Advanced epoxy | Hardener | Content of P (%) | (° C.) | Air | N₂ | Air | N₂ | Step 1 Air | Step 1 N₂ | Step 2 Air | Step 2 N₂ | Air | N₂ |
| P-B | PN | 2.20 | 120 | 377 | 383 | 407 | 401 | 444 | 441 | 590 | 597 | 20 | 26 |
| P-C | PN | 2.96 | 115 | 367 | 367 | 397 | 393 | 452 | 438 | 622 | 614 | 22 | 27 |
| Control | MPN | 0 | 125 | 393 | 407 | 417 | 427 | 474 | 478 | 623 | — | 1 | 16 |
| P-A | MPN | 1.67 | 143 | 367 | 377 | 387 | 397 | 438 | 450 | 633 | — | 15 | 20 |
| P-B | MPN | 2.36 | 140 | 357 | 367 | 377 | 387 | 415 | 435 | 641 | 585 | 18 | 22 |
| P-C | MPN | 2.97 | 136 | 347 | 347 | 367 | 369 | 397 | 415 | 662 | 612 | 21 | 25 |
| Control | DICY | 0 | 132 | 393 | 393 | 417 | 417 | 478 | 481 | 628 | 658 | 2 | 6 |
| P-A | DICY | 1.86 | 150 | 367 | 377 | 387 | 387 | 433 | 441 | 627 | 676 | 12 | 16 |
| P-B | DICY | 2.61 | 140 | 357 | 363 | 377 | 387 | 429 | 419 | 621 | 692 | 15 | 19 |
| P-C | DICY | 3.26 | 137 | 347 | 353 | 363 | 367 | 390 | 407 | 614 | 674 | 17 | 21 |
| BHPP | PN | 4.27 | 105 | 345 | 347 | 361 | 361 | 380 | 376 | 532 | 530 | 35 | 37 |
| TBBA | PN | 17.72* | 124 | 361 | 363 | 365 | 367 | 386 | 380 | — | — | 10 | 23 |

*Content of Br
—: Step 2 of rapid rate was not found

TABLE 2

Flame retardant properties (UL-94 test)

| Specimens | Content of flame-retardant element (%) | Burning time (Sec) | Fume* | Drip | Classification |
|---|---|---|---|---|---|
| PN Control | P (0.00%) | 89 | — | Yes | V-2 |
| P-A-PN | P (1.54%) | 18 | — — | No | V-1 |
| P-B-PN | P (2.20%) | 0 | — — | No | V-0 |
| P-C-PN | P (2.96%) | 0 | — — | No | V-0 |
| MPN Conrol | P/N (0.00%/3.11%) | 36 | + | No | V-2 |
| P-A-MPN | P/N (1.67/3.93%) | 2 | — — | No | V-0 |
| P-B-MPN | P/N (2.36/3.71%) | 0 | — — | No | V-0 |
| P-C-MPN | P/N (2.97/3.11%) | 0 | — — | No | V-0 |
| DICY Control | P/N (0.00/2.78%) | 52 | + | No | V-2 |
| P-A-DICY | P/N (1.86/3.36%) | 0 | — — | No | V-0 |
| P-B-DICY | P/N (2.61/3.14%) | 0 | — — | No | V-0 |
| P-C-DICY | P/N (3.26/2.96%) | 0 | — — | No | V-0 |
| TBBA/PN | Br (17.72%) | 1 | ++ | Yes | V-0 |
| BHPP/PN | P (4.27%) | 0 | — — | No | V-0 |

*++: heavy;
+: slightly;
—: scarcely;
— —: no fume.

The data in Tables 1 and 2 show that the cured epoxy resins prepared from the ODOPM-BPA advanced epoxy resins of the present invention have excellent flame retardant properties in comparison with the conventional cured epoxy resins prepared from BPA advanced epoxy resins, especially no fume and dripping occur in the combustion test, and thus is very suitable for the printed circuit board applications. Curing of Epoxy Resins with the Phosphorus-containing Hardeners and Nitrogen-phosphorus-containing Hardeners i). Using P-1 to P-16 hardeners

Examples 1–16

Cured epoxy resins were prepared from a cresol formaldehyde novolac epoxy resin (CNE) with the hardeners P-1 to P-16 prepared in Examples 1 to 16 in an equivalent ratio of epoxide:active hydrogen=1:1 and with 0.2 wt % of triphenylphosphine as a curing accelerator. The mixture was grounded into fine powders to give thermosettable epoxy resin powders. The resin powders were cured in a mold at 150° C. and 50 kg/cm² for a period of one hour and then at 170° C. for two hours and further postcured at 200° C. for three hours to obtain cured specimens.

Control Example 1

The procedures of Example 1 were repeated except that ODOPM-BPA-A (P-1-A) used in Example 1 was replaced by phenol formaldehyde novolac resin (PN) to cure the cresol formaldehyde novolac epoxy resin (CNE) in the curing reaction.

Control Example 2

The procedures of Example 1 were repeated except that ODOPM-BPA-A (P-1-A) used in Example 1 was replaced by tetrabromobisphenol A (TBBA) to cure the cresol formaldehyde novolac epoxy resin (CNE) in the curing reaction.

Control Example 3

The procedures of Example 1 were repeated except that ODOPM-BPA-A (P-1-A) used in Example 1 was replaced by bis(3-hydroxyphenyl) phenyl phosphate (BHPP) to cure the cresol formaldehyde novolac epoxy resin (CNE) in the curing reaction.

Control Example 4

The procedures of Example 1 were repeated except that ODOPM-BPA-A (P-1-A) used in Example 1 was replaced by dicyandiamide (DICY) to cure the cresol formaldehyde novolac epoxy resin (CNE) in the curing reaction.

Control Example 5

The procedures of Example 1 were repeated except that ODOPM-BPA-A (P-1-A) used in Example 1 was replaced by melamine (MA) to cure the cresol formaldehyde novolac epoxy resin (CNE) in the curing reaction.

Control Example 6

The procedures of Example 1 were repeated except that ODOPM-BPA-A (P-1-A) used in Example 1 was replaced by bisphenol A (BPA) to cure the cresol formaldehyde novolac epoxy resin (CNE) in the curing reaction.

Control Example 7

The procedures of Example 1 were repeated except that ODOPM-BPA-A (P-1-A) used in Example 1 was replaced by diaminodiphenylmethane (DDM) to cure the cresol formaldehyde novolac epoxy resin (CNE) in the curing reaction.

Control Example 8

The procedures of Example 1 were repeated except that ODOPM-BPA-A (P-1-A) used in Example 1 was replaced by diaminodiphenyl sulfone (DDS) to cure the cresol formaldehyde novolac epoxy resin (CNE) in the curing reaction.

The dynamic mechanical analysis (DMA) properties of the resulting cured epoxy resins are shown in Table 3; the thermogravimetric analysis data thereof are shown in Table 4; and the flame-retardant properties thereof are shown in Table 5.

TABLE 3 dynamic mechanical analysis (DMA) properties

| Specimens | Hardeners | Glass transition temperature (Tg, ° C.) | Flexural strength at 50° C. dyne/cm |
|---|---|---|---|
| Example 1 | P-1 | 154 | 6.9 |
| Example 2 | P-2 | 142 | 7.3 |
| Example 3 | P-3 | 232 | 7.8 |
| Example 4 | P-4 | 186 | 7.1 |
| Example 5 | P-5 | 243 | 8.3 |
| Example 6 | P-6 | 202 | 7.4 |
| Example 7 | P-7 | 226 | 8.1 |
| Example 8 | P-8 | 178 | 7.2 |
| Example 9 | P-9 | 208 | 8.1 |
| Example 10 | P-10 | 186 | 7.1 |
| Example 11 | P-11 | 223 | 8.5 |
| Example 12 | P-12 | 189 | 7.8 |
| Example 13 | P-13 | 224 | 8.3 |

TABLE 3-continued dynamic mechanical analysis (DMA) properties

| Specimens | Hardeners | Glass transition temperature (Tg, ° C.) | Flexural strength at 50° C. dyne/cm |
|---|---|---|---|
| Example 14 | P-14 | 181 | 7.2 |
| Example 15 | P-15 | 225 | 8.3 |
| Example 16 | P-16 | 187 | 7.5 |
| Control Ex. 1 | PN | 176 | 7.2 |
| Control Ex. 2 | TBBA | 120 | 6.1 |
| Control Ex. 3 | BHPP | 125 | 6.8 |
| Control Ex. 4 | DICY | 243 | 8.1 |
| Control Ex. 5 | MA | 211 | 8.1 |
| Control Ex. 6 | BPA | 150 | 6.8 |
| Control Ex. 7 | DDM | 238 | 8.5 |
| Control Ex. 8 | DDS | 242 | 8.7 |

TABLE 4

TGA data

| Specimens | Hardener | Td 10% ° C. | Maximum thermal degradation temperature ° C. | Char yield (%) at 700° C. |
|---|---|---|---|---|
| Example 1 | P-1 | 383 | 413 | 32 |
| Example 2 | P-2 | 471 | 405 | 31 |
| Example 3 | P-3 | 373 | 398 | 42 |
| Example 4 | P-4 | 371 | 395 | 39 |
| Example 5 | P-5 | 387 | 401 | 40 |
| Example 6 | P-6 | 381 | 401 | 38 |
| Example 7 | P-7 | 387 | 421 | 37 |
| Example 8 | P-8 | 385 | 413 | 34 |
| Example 9 | P-9 | 387 | 421 | 42 |
| Example 10 | P-10 | 381 | 403 | 40 |
| Example 11 | P-11 | 395 | 429 | 38 |
| Example 12 | P-12 | 389 | 403 | 36 |
| Example 13 | P-13 | 391 | 411 | 38 |
| Example 14 | P-14 | 385 | 403 | 35 |
| Example 15 | P-15 | 395 | 429 | 42 |
| Example 16 | P-16 | 383 | 413 | 39 |
| Control Ex. 1 | PN | 427 | 473 | 29 |
| Control Ex. 2 | TBBA | 387 | 407 | 34 |
| Control Ex. 3 | BHPP | 393 | 409 | 37 |
| Control Ex. 4 | DICY | 418 | 468 | 12 |
| Control Ex. 5 | MA | 395 | 441 | 12 |
| Control Ex. 6 | BPA | 417 | 446 | 15 |
| Control Ex. 7 | DDM | 413 | 422 | 30 |
| Control Ex. 8 | DDS | 417 | 438 | 28 |

TABLE 5

Flame retardant properties (UL-94 test)

| Specimens | Hardener | Content of P, N or Br | Burning time (Sec) | Drip | Fume | Classification |
|---|---|---|---|---|---|---|
| Example 1 | P-1 | P (3.62) | 0 | No | No | V-0 |
| Example 2 | P-2 | P (3.54) | 0 | No | No | V-0 |
| Example 3 | P-3 | P/N (3.75/3.39) | 0 | No | No | V-0 |
| Example 4 | P-4 | P/N (3.67/3.31) | 0 | No | No | V-0 |
| Example 5 | P-5 | P/N (3.54/3.19) | 0 | No | No | V-0 |
| Example 6 | P-6 | P/N (3.47/3.13) | 0 | No | No | V-0 |
| Example 7 | P-7 | P/N (2.29/6.20) | 0 | No | No | V-0 |
| Example 8 | P-8 | P/N (2.25/6.11) | 0 | No | No | V-0 |
| Example 9 | P-9 | P/N (3.38/6.09) | 0 | No | Yes | V-0 |
| Example 10 | P-10 | P/N (3.32/6.01) | 0 | No | No | V-0 |
| Example 11 | P-11 | P/N (2.38/4.30) | 0 | No | No | V-0 |
| Example 12 | P-12 | P/N (2.35/4.24) | 0 | No | No | V-0 |
| Example 13 | P-13 | P/N (2.31/6.27) | 0 | No | No | V-0 |
| Example 14 | P-14 | P/N (2.30/6.25) | 0 | No | No | V-0 |
| Example 15 | P-15 | P/N (3.44/6.22) | 0 | No | No | V-0 |
| Example 16 | P-16 | P/N (3.43/6.19) | 0 | No | No | V-0 |
| Control Ex. 1 | PN | 0 | 86 | Yes | No | V-2 |
| Control Ex. 2 | TBBA | Br (21.19) | 0 | Yes | Yes | V-0 |
| Control Ex. 3 | BHPP | P (4.20) | 0 | No | No | V-0 |
| Control Ex. 4 | DICY | N (6.32) | 46 | Yes | Yes | V-2 |
| Control Ex. 5 | MA | N (6.31) | 32 | No | Yes | V-2 |
| Control Ex. 6 | BPA | 0 | 91 | Yes | Yes | V-2 |
| Control Ex. 7 | DDM | N (2.81) | 83 | Yes | Yes | V-2 |
| Control Ex. 8 | DDS | N (2.67) | 78 | Yes | Yes | V-2 |

It can be seen from Table 3 that the cured epoxy resins of the present invention have glass transition temperatures (Tg) about 60° C. higher than that of the epoxy resin cured with the conventional flame-retardant TBBA hardener, The data in Table 4 show that the cured epoxy resins of the present invention have a better thermal stability and higher char yield than those of the conventional epoxy resin cured by flame-retardant TBBA. The data in Table 5 indicate that the cured epoxy resins of the present invention have excellent flame retardant properties, especially no fume and dripping occur in the combustion test, and thus is very suitable for use in the semiconductor encapsulation applications. The flame-retardant hardeners containing the phosphorus-containing rigid groups disclosed in the present invention can be used to prepare flame-retardant cured epoxy resins having improved thermal properties and flame-retardancy, as shown in Tables 3 to 5. The nitrogen and phosphorus elements contained in the hardeners of the present invention have a synergistic effect in flame-retardancy of the cured epoxy resin.

ii). Using phosphorus-containing BPA hardener (P-1-A) prepared in

Preparation Example 1-A

Various amounts of the hardener ODOPM-BPA-A (P-1-A) were separately mixed with bisphenol (BPA) to form a mixed curing agent for cresol formaldehyde novolac epoxy resin (CNE) to determine the flame-retardant effect of phosphorus. The mixed curing agents consisting of P-1-A/BPA in various weight ratios (0/100, 25/75, 50/50, 75/25, and 100/0) were prepared. Triphenyl phosphine (Ph$_3$P) powder was used as a curing accelerator. The CNE was mixed with the above mixed curing agents and 0.2 wt % Ph$_3$P in a mill at 25° C. to give thermosettable epoxy resin powders, wherein the equivalent ratio of epoxide group to hydroxyl group is 1:1. The resin powders were cured in a mould at 150° C. and 50 kg/cm$^2$ for a period of one hour and then at 170° C. for two hours and further postcured at 200° C. for three hours to obtain cured specimens.

For comparison, various weight ratios of tetrabromobisphenol A (TBBA) and PN (25/75, 75/25, 100/0) were also used as a curing agent to prepare the cured specimens as above.

The cured specimens were subjected to the thermogravimetric analysis and the UL-94 test. The results are shown in Table 6 and Table 7.

It can be seen from Table 6 that the Tg values of the phosphorus-containing cured epoxy resin specimens of the present invention (P-1-A/BPA) are about 30° C. higher than those of the conventional bromine-containing cured epoxy resin specimens. Furthermore, the phosphorus-containing cured epoxy resin specimens of the present invention exhibit significantly higher thermal degradation temperatures and higher char yields in comparison with the conventional bromine-containing cured epoxy resin specimens.

The data in Table 7 show that 1.13% phosphorus content of the phosphorus-containing cured epoxy resin of the present invention can produce substantially the same flame-retardant effect as 11.92% bromine content of the conventional bromine-containing cured epoxy resin. In addition, the phosphorus-containing cured epoxy resin specimens of the present invention generate much less fumes in the combustion test.

The results shown in Tables 6 and 7 indicate that the phosphorus-containing cured epoxy resin of the present invention is very suitable for semiconductor encapsulation applications.

TABLE 6

TGA data

| Specimens | Content of flame-retardant element | Tg(° C.) | Temperature of 5 wt % loss, ° C. | | Temperature of 10 wt % loss, ° C. | | Rapid rate Tr (° C.) | | | | Char yield at 700° C.,(%) | |
|---|---|---|---|---|---|---|---|---|---|---|---|---|
| | | | | | | | Step 1 | Step 1 | Step 2 | Step 2 | | |
| | | | Air | $N_2$ | Air | $N_2$ | Air | $N_2$ | Air | $N_2$ | Air | $N_2$ |
| | P (%) | | | | | | | | | | | |
| P-1-A/BPA (0/100) | 0 | 150 | 407 | 397 | 421 | 417 | 436 | 446 | — | — | 4 | 15 |
| P-1-A/BPA (25/75) | 1.13 | 142 | 397 | 387 | 413 | 413 | 435 | 440 | — | — | 8 | 21 |
| P-1-A/BPA (50/50) | 2.08 | 146 | 383 | 381 | 405 | 401 | 425 | 435 | 620 | — | 15 | 24 |
| P-1-A/BPA (75/25) | 2.91 | 151 | 363 | 367 | 393 | 393 | 416 | 421 | 610 | — | 21 | 27 |
| P-1-A/BPA (100/0) | 3.62 | 154 | 357 | 353 | 393 | 383 | 412 | 413 | 561 | 567 | 28 | 32 |
| | Br (%) | | | | | | | | | | | |
| TBBA/PN (25/75) | 6.39 | 130 | 371 | 381 | 379 | 383 | 385 | 393 | — | — | 5 | 16 |
| TBBA/PN (50/50) | 11.92 | 127 | 369 | 377 | 379 | 387 | 385 | 395 | — | — | 7 | 17 |
| TBBA/PN (75/25) | 16.82 | 124 | 363 | 367 | 369 | 391 | 387 | 401 | — | — | 10 | 23 |
| TBBA/PN (100/0) | 21.29 | 121 | 367 | 369 | 371 | 395 | 391 | 407 | — | — | 12 | 25 |

—: Step 2 of rapid rate was not found

TABLE 7

Flame retardant properties (UL-94 test)

| Specimens | | Burning time (Sec) | Fume* | Drip | Classification |
|---|---|---|---|---|---|
| P-1-A/BPA | P % | | | | |
| 0/100 | 0 | 91 | + | Yes | V-2 |
| 25/75 | 1.13 | 8 | + | No | V-0 |
| 50/50 | 2.08 | 0 | — — | No | V-0 |
| 75/25 | 2.91 | 0 | — — | No | V-0 |
| 100/0 | 3.92 | 0 | — — | No | V-0 |
| TBBA/PN | Br % | | | | |
| 25/75 | 6.39 | 20 | ++ | Yes | V-1 |
| 50/50 | 11.92 | 6 | ++ | Yes | V-0 |
| 75/25 | 16.82 | 0 | + | No | V-0 |
| 100/0 | 21.19 | 0 | — | No | V-0 |

*++: heavy;
+: slightly;
—: scarcely;
— —: no fume.

The phosphorus-containing compounds (A)–(I) of the present invention have an active hydrogen, and thus can be used as a staring material for the preparation of flame-retardant epoxy resins by reacting with epihalohydrin under alkaline condition as disclosed in U.S. Pat. No. 4,499,255. The details of this US patent are incorporated herein by reference. The flame-retardant epoxy resins so prepared will have one of the formulas (EP-A) to (EP-I) as follows:

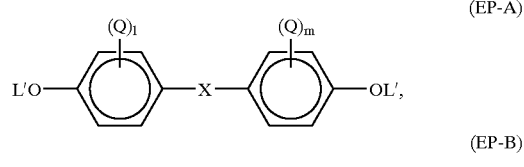

wherein l, m, i, j, k, Z, X, Q and Q' are defined as above; and L' is hydrogen or

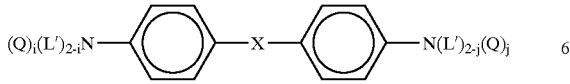

provided that at least two L' are L.

Preferably, the flame-retardant epoxy resins (EP-A) to (EP-I) are prepared from the preferred phosphorus-containing compounds of the present invention.

Preferably, the flame retardant epoxy resin has the formula (EP-A).

Preferably, the flame retardant epoxy resin has the formula (EP-B).

The present invention further synthesizes a phosphorus-containing flame-retardant cured epoxy resin by curing the epoxy resin selected from (EP-A) to (EP-I) with the conventional curing agent for the epoxy resin, which preferably is selected from the group consisting of pherol-formaldehyde novolac resin, dicyandiamide and hexahydrophthalic anhydride. Preferably, the curing reaction is carried out at a temperature higher than 150° C. and with stoichiometric amount of the curing agent (hardener). More preferably, the curing reaction is carried out in the presence of a curing promoter such as triphenylphosphine, and in an amount of 0.01~10.0 parts by weight of the curing promotor per 100 parts by weight of the epoxy resin. The phosphorus-containing flame-retardant cured epoxy resin of the present invention is suitable for use in making a flame-retardant printed circuit board as a matrix resin and in semiconductor encapsulations.

Preparation of Phosphorus-containing Epoxy Resins and Cured Epoxy Resins i). Preparation of phosphorus-containing epoxy resins

Example 17 (P-D)

To a reaction vessel equipped with a temperature controller, a mechanical stirrer, a reflux condenser, a dean stark trap and a vacuum system was added 91.2 g (0.4 equivalent) of 2-(6-oxid-6H-dibenz<c,e><1,2>oxa-phosphorin-6-yl)methyl-bisphenol-A (ODOPM-BPA-A) (P-1-A), 185 g (2 equivalents) of epichlorohydrin (EPI), and 54 g of 1-methoxy-2-hydroxy propane as a solvent. After stirring at room temperature and atmospheric pressure to thoroughly mix the contents, the temperature was raised to 65° C. and the pressure was reduced to 160 mm Hg absolute. To the resultant solution was continuously added 32 g of 50% aqueous sodium hydroxide solution at a constant rate over a period of 1 hour. During the addition of the sodium hydroxide, the water was removed by codistilling with epichlorohydrin and solvent. The distillate was condensed and introduced into the dean stark trap, wherein two distinct phases, an aqueous phase (top) and an organic epichlorohydrin-solvent phase (bottom) were formed. The aqueous phase was removed continuously and disregarded. The organic phase was continuously returned to the reactor. After completion of the sodium hydroxide addition, the reaction mixture was maintained at a temperature of 65° C. and a pressure of about 160 mm Hg absolute for an additional 30 minutes. The reaction mixture was washed with deionized water two or three times to remove salt after cooling, and subsequently distilled to remove residual EPI resulting in a phosporus-containing epoxy resin (P-D) having an epoxide equivalent weight (EEW) of 298–301.

Example 18 (P-E)

The procedures of Example 17 were repeated except that 82.8 g (0.4 equivalent) 2-(6-oxid-6H-dibenz<c,e><1,2>oxa-phosphorin-6-yl)methyl-4,4'-biphenol-A (ODOPM-BP) was used to replace ODOPM-BPA-A (P-1-A). The resultant phosphorus-containing epoxy resin (P-E) had an EEW of 279–281.

Example 19 (P-F)

The procedures of Example 17 were repeated except that 95.6 g (0.4 equivalent) 2-(6-oxid-6H-dibenz<c,e><1,2>oxa-phosphorin-6-yl)methyl-4,4'-sulfonyl diphenol-A (ODOPM-SDP) was used to replace ODOPM-BPA-A (P-1-A). The resultant phosphorus-containing epoxy resin (P-F) had an EEW of 315–319.

Control Example 9 (BPA-9)

The procedures of Example 17 were repeated except that 45.6 g (0.4 equivalent) bisphenol-A (BPA) was used to replace ODOPM-BPA-A (P-1-A). The resultant phosphorus-containing epoxy resin (BPA-9) had an EEW of 181–185.

Control Example 10 (BP-10)

The procedures of Example 17 were repeated except that 37.2 g (0.4 equivalent) 4,4'-biphenol-A (BP) was used to replace ODOPM-BPA-A (P-1-A). The resultant phosphorus-containing epoxy resin (BP-10) had an EEW of 159–162.

Control Example 11 (SDP-11)

The procedures of Example 17 were repeated except that 50 g (0.4 equivalent) 4,4'-sulfonyl diphenol (SDP) was used to replace ODOPM-BPA-A (P-1-A). The resultant phosphorus-containing epoxy resin (SDP-11) had an EEW of 191–195.

Control Example 12 (TBBA-12)

The procedures of Example 17 were repeated except that 108.8 g (0.4 equivalent) tetrabromobisphenol A (TBBA) was used to replace ODOPM-BPA-A (P-1-A). The resultant phosphorus-containing epoxy resin (TBBA-12) had an EEW of 356–359.

Control Example 13 (BHPP-13)

The procedures of Example 17 were repeated except that 71.6 g (0.4 equivalent) bis(3-hydroxyphenyl) phenyl phosphate (BHPP) was used to replace ODOPM-BPA-A (P-1-A). The resultant phosphorus-containing epoxy resin (BHPP-13) had an EEW of 253–256.

ii). Preparation of a cured epoxy resin from a phosphorus-containing epoxy resin Cured epoxy resins were prepared from the epoxy resins prepared in Examples 17–19 and Control Examples 9–13 with phenol-formaldehyde novolac resin (PN) as a curing agent.

The epoxy resin was mixed with the curing agent (1:1 equivalent ratio) at 150° C. with stirring, and the well mixed molten mixture was poured into a hot aluminum mould, cured in an oven at 170° C. for one hour, and then postcured at 200° C. for two hours.

The dynamic mechanical analysis (DMA) properties of the resulting cured epoxy resins are shown in Table 8; the thermogravimetric analysis data thereof are shown in Table 9; and the flame-retardant properties thereof are shown in Table 10.

TABLE 8 dynamic mechanical analysis (DMA) properties

| Specimens | Epoxy resins | Glass transition temperature (Tg, ° C.) | Flexural strength at 50° C. dyne/cm |
|---|---|---|---|
| Example 17 | P-D | 132 | 6.5 |
| Example 18 | P-E | 127 | 6.9 |
| Example 19 | P-F | 189 | 8.1 |
| Control Ex. 9 | BPA-9 | 127 | 6.3 |
| Control Ex. 10 | BP-10 | 121 | 6.5 |
| Control Ex. 11 | SDP-11 | 187 | 8.3 |
| Control Ex. 12 | TBBA-12 | 117 | 6.3 |
| Control Ex. 13 | BHPP-13 | 105 | 6.9 |

TABLE 9

TGA data

| Specimens | Epoxy resins | Td 10% ° C. | Maximum thermal degradation temperature ° C. | Char yield (%) at 700° C. |
|---|---|---|---|---|
| Example 17 | P-D | 397 | 427 | 42 |
| Example 18 | P-E | 401 | 441 | 44 |
| Example 19 | P-F | 381 | 398 | 38 |
| Control Ex. 9 | BPA-9 | 417 | 442 | 26 |
| Control Ex. 10 | BP-10 | 425 | 456 | 24 |
| Control Ex. 11 | SDP-11 | 393 | 409 | 18 |
| Control Ex. 12 | TBBA-12 | 409 | 418 | 35 |
| Control Ex. 13 | BHPP-13 | 377 | 393 | 38 |

TABLE 10

Flame retardant properties (UL-94 test)

| Specimens | Epoxy resins | Content of P or Br | Burning time (Sec) | Drip | Fume | Classification |
|---|---|---|---|---|---|---|
| Example 17 | P-D | P (4.04) | 0 | No | No | V-0 |
| Example 18 | P-E | P (4.29) | 0 | No | No | V-0 |
| Example 19 | P-F | P (3.88) | 0 | No | No | V-0 |
| Control Ex. 9 | BPA-9 | 0 | 81 | No | Slightly | V-2 |
| Control Ex. 10 | BP-10 | 0 | 93 | No | Slightly | V-2 |
| Control Ex. 11 | SDP-11 | 0 | 72 | Yes | Yes | V-2 |
| Control Ex. 12 | TBBA-12 | Br (37.7) | 0 | No | No | V-0 |
| Control Ex. 13 | BHPP-13 | P (4.64) | 0 | No | No | V-0 |

It can be seen from Table 8 that the cured epoxy resins of the present invention have glass transition temperatures (Tg) about higher than those of the conventional bisphenol-A cured epoxy resin and the conventional flame-retardant TBBA cured epoxy resin. The data in Table 9 show that the cured epoxy resins of the present invention have a better thermal stability and higher char yield than those of the conventional flame-retardant TBBA epoxy resin cured by phenol-formaldehyde novolac resin (PN). The data in Table 10 indicate that the cured epoxy resins of the present invention have excellent flame retardant properties, especially no fume and dripping occur in the combustion test, and thus is very suitable for use in the semiconductor encapsulation applications. The flame-retardant epoxy resins containing the phosphorus-containing rigid group (ODOPM) bonded to BPA, BP and SDP disclosed in the present invention can be used to prepare flame-retardant cured epoxy resins having improved thermal properties and flame-retardancy, as shown in Tables 8 to 10.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A phosphorus-containing flame-retardant hardener having a formula selecting from the group consisting of (A) to (I):

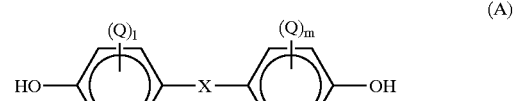

(A)

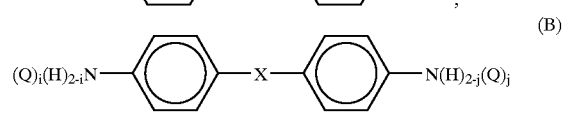

(B)

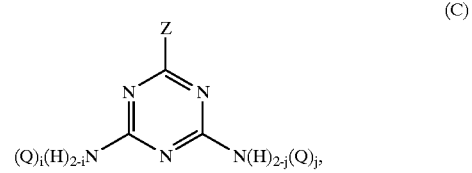

(C)

-continued

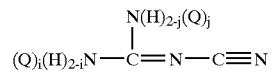

(D)

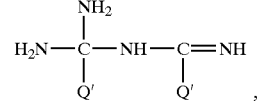

(E)

-continued (F)

$$H_2N-\overset{NH}{\underset{\phantom{X}}{C}}-NH-\overset{}{\underset{Q'}{C}}=NH$$

(G)

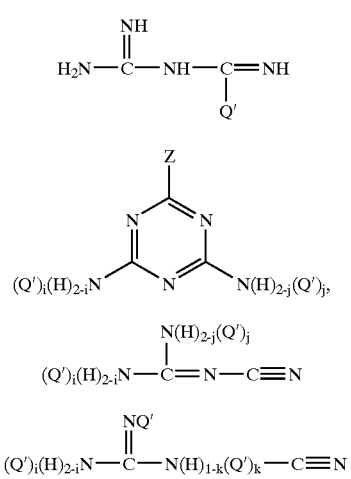

(H)

(I)

wherein
I and m independently are 0, 1 or 2, and I+m>0; i and j independently are 0, 1 or 2, and 0<i+j<4; k is 0 or 1, and i+k<3;
Z is —NH$_2$, —CH$_3$ or phenyl;

X:

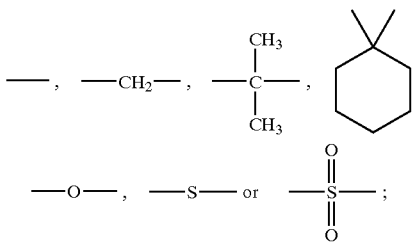

Q:

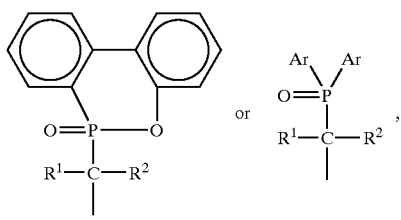

Q':

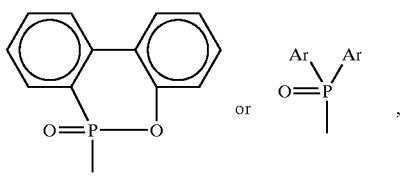

wherein
R$^1$, R$^2$ independently are H, C1~C18 alkyl, C6~C18 aryl, C6~C18 substituted aryl, C6~C18 aryl methylene, or C6~C18 substituted aryl methylene;

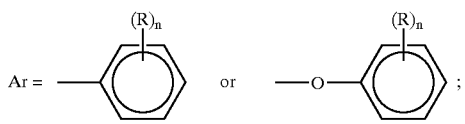

wherein R is C1–C4 alkyl or C6–C18 aryl; and n is an integer of 0 to 5, wherein when said hardener has the formula (C):

Q:

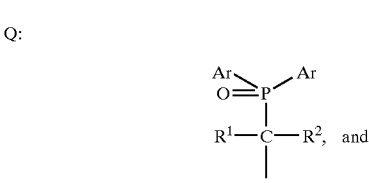

wherein when said hardener has the formula of (G):

Q':

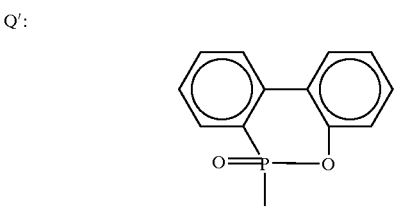

2. The hardener according to claim 1, wherein the hardener has the formula (A).

3. The hardener according to claim 1, wherein the hardener has the formula (B).

4. The hardener according to claim 1, wherein the hardener has the formula (C).

5. The hardener according to claim 1, wherein the hardener has the formula (D).

6. The hardener according to claim 1, wherein the hardener has the formula (E) or (F).

7. The hardener according to claim 1, wherein the hardener has formula (G).

8. The hardener according to claim 1, wherein the hardener has the formula (H) or (I).

9. The hardener according to claim 1, wherein i and j are 0 or 1, when the hardener has a formula selected from the group consisting of (B), (C), (D), (G) and (H).

10. The hardener according to claim 8, wherein k is 0, when the hardener has the formula (I).

11. The hardener according to claim 4, wherein Z is —NH$_2$.

12. The hardener according to claim 7, wherein Z is —NH$_2$.

13. The hardener according to claim 2, wherein R$^1$ and R$^2$ are hydrogen, and n is 0.

14. The hardener according to claim 3, wherein R$^1$ and R$^2$ are hydrogen, and n is 0.

15. The hardener according to claim 4, wherein R$^1$ and R$^2$ are hydrogen, and n is 0.

16. The hardener according to claim 5, wherein R$^1$ and R$^2$ are hydrogen, and n is 0.

17. The hardener according to claim 13, wherein Ar is phenoxy.

18. The hardener according to claim 14, wherein Ar is phenoxy.

19. The hardener according to claim 15, wherein Ar is phenoxy.

20. The hardener according to claim 16, wherein Ar is phenoxy.

21. The hardener according to claim 6, wherein Ar is phenyl.
22. The hardener according to claim 7, wherein Ar is phenyl.
23. The hardener according to claim 8, wherein Ar is phenyl.
24. The hardener according to claim 2, wherein X is
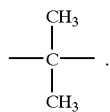
25. The hardener according to claim 3, wherein X is —CH$_2$— or
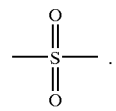
* * * * *